(12) United States Patent
Jung et al.

(10) Patent No.: US 11,908,527 B2
(45) Date of Patent: Feb. 20, 2024

(54) MEMORY DEVICE AND METHOD OF OPERATING THE MEMORY DEVICE

(71) Applicant: SK hynix Inc., Icheon-si (KR)

(72) Inventors: Dong Jae Jung, Icheon-si (KR); Sung Won Bae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 92 days.

(21) Appl. No.: 17/682,362

(22) Filed: Feb. 28, 2022

(65) Prior Publication Data

US 2023/0085319 A1    Mar. 16, 2023

(30) Foreign Application Priority Data

Sep. 15, 2021  (KR) .......................... 10-2021-0123530

(51) Int. Cl.
*G11C 16/26* (2006.01)
*G06F 11/10* (2006.01)
*G11C 16/24* (2006.01)
*G11C 16/08* (2006.01)

(52) U.S. Cl.
CPC .......... *G11C 16/26* (2013.01); *G06F 11/1044* (2013.01); *G11C 16/08* (2013.01); *G11C 16/24* (2013.01)

(58) Field of Classification Search
None
See application file for complete search history.

(56) References Cited

FOREIGN PATENT DOCUMENTS

| KR | 1020100033192 A | 3/2010 |
| KR | 1020120050715 A | 5/2012 |
| KR | 20210072819 | * 6/2021 |

* cited by examiner

*Primary Examiner* — April Y Blair
*Assistant Examiner* — Matthew W Wahlin
(74) *Attorney, Agent, or Firm* — William Park & Associates Ltd.

(57) ABSTRACT

The present technology relates to an electronic device. According to the present technology, a memory device may include memory cells respectively connected to a plurality of word lines, a peripheral circuit configured to perform a read operation of reading data stored in selected memory cells connected to a selected word line among the memory cells, and a read operation controller configured to control the peripheral circuit to apply a pass voltage to adjacent word lines adjacent to the selected word line during the read operation, discharge the pass voltage to a target pass voltage less than the pass voltage after a predetermined time elapses, and obtain data stored in the selected memory cells through bit lines connected to the selected memory cells after a target read time elapses, after a voltage applied to the adjacent word lines is discharged to the target pass voltage.

20 Claims, 18 Drawing Sheets

FIG. 14

| | MAGNITUDE |
|---|---|
| START PASS VOLTAGE | Vstart |
| STEP VOLTAGE | Vstep |
| TARGET PASS VOLTAGE | Vtarget |
| FIRST MAINTENANCE TIME | Tstep1 |
| SECOND MAINTENANCE TIME | Tstep2 |
| TARGET READ TIME | Ttarget |
| STEP READ TIME | Δt |

PASS VOLTAGE INFORMATION: START PASS VOLTAGE, STEP VOLTAGE, TARGET PASS VOLTAGE, FIRST MAINTENANCE TIME, SECOND MAINTENANCE TIME

READ TIME INFORMATION: TARGET READ TIME, STEP READ TIME

FIG. 15

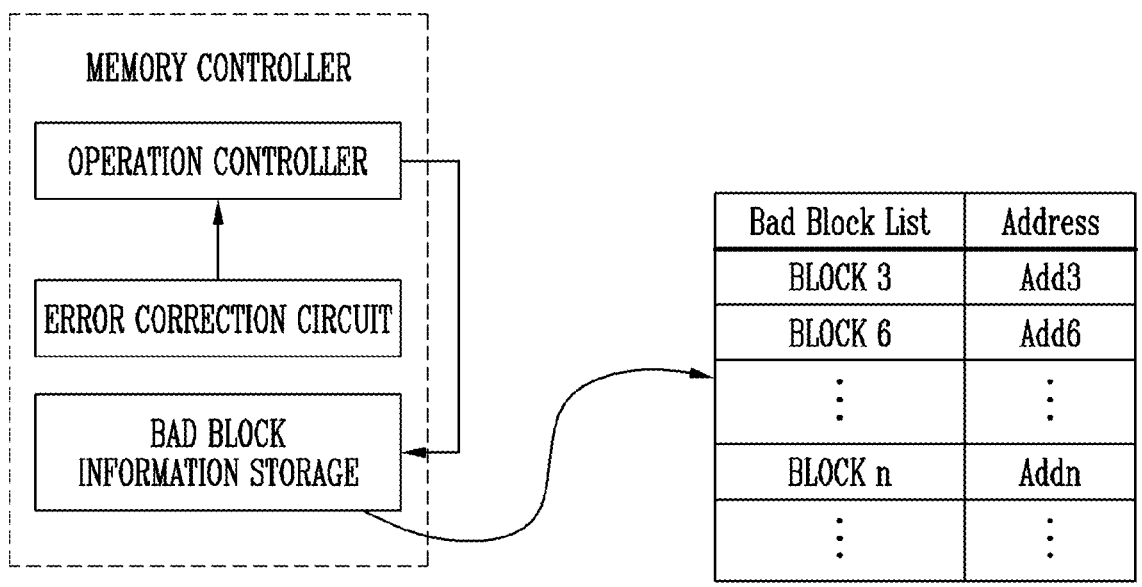

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2021-0123530, filed on Sep. 15, 2021, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under control of a host device such as a computer or a smartphone. A storage device may include a memory device in which data is stored and a memory controller controlling the memory device. The memory device is divided into a volatile memory device and a nonvolatile memory device.

The volatile memory device is a device that stores data only when power is supplied and loses the stored data when the power supply is cut off. The volatile memory device includes a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

According to an embodiment of the present disclosure, a memory device may include a plurality of memory cells respectively connected to a plurality of word lines, a peripheral circuit configured to perform a read operation of reading data stored in selected memory cells among the plurality of memory cells, the selected memory cells connected to a selected word line among the plurality of word lines, and a read operation controller configured to control the peripheral circuit to apply a pass voltage to adjacent word lines among the plurality of word lines adjacent to the selected word line during the read operation, discharge the pass voltage to a target pass voltage less than the pass voltage after a predetermined time elapses, and obtain data stored in the selected memory cells through bit lines connected to the selected memory cells after a target read time elapses, after a voltage applied to the adjacent word lines is discharged to the target pass voltage.

According to an embodiment of the present disclosure, a storage device may include a memory controller configured to output a read command for selected memory cells and an address for a selected word line connected to the selected memory cells, and a memory device configured to apply a pass voltage to adjacent word lines adjacent to the selected word line by receiving the read command and an address corresponding to the read command, discharge the pass voltage to a target pass voltage less than the pass voltage by a step voltage after a predetermined time elapses, and perform an open read operation of obtaining data stored in the selected memory cells through bit lines connected to the selected memory cells after a target read time elapses, after a voltage applied to the adjacent word lines is discharged to the target pass voltage.

According to an embodiment of the present disclosure, a method of an electronic device that performs a read operation repeatedly in order to read data stored in selected memory cells connected to a selected word line among a plurality of word lines included in a target memory block among a plurality of memory blocks may include applying a pass voltage to word lines adjacent to the target word line, decreasing the pass voltage by a step voltage every predetermined time until the pass voltage reaches a target pass voltage, sensing a potential of bit lines connected to the selected memory cells connected to the selected word line after a magnitude of the pass voltage reaches the target pass voltage and a predetermined target read time elapses, and determining whether the read operation has passed or failed by comparing the number of error bits of data read from the selected memory cells with the number of correctable error bits.

According to an embodiment of the present disclosure, a method of an electronic device that performs a read operation of reading data stored in selected memory cells connected to a selected word line among a plurality of word lines included in a target memory block among a plurality of memory blocks may include applying a pass voltage to word lines adjacent to the target word line, discharging the pass voltage to a target pass voltage less than the pass voltage by a step voltage, sensing a potential of bit lines connected to the selected memory cells connected to the selected word line after a predetermined target read time elapses, and determining whether the read operation has passed or failed by comparing the number of error bits of data read from the selected memory cells with the number of correctable error bits.

BRIEF DESCRIPTION OF THE DRAWINGS

FIG. 14 is a diagram illustrating an open read information storage according to an embodiment.

FIG. 15 is a diagram illustrating a bad block information storage according to an embodiment.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, the present disclosure is described in detail by describing embodiments of the present disclosure with reference to the accompanying drawings. Hereinafter, embodiments of the present disclosure are described in detail with reference to the accompanying drawings.

An embodiment of the present disclosure provides a memory device that recovers data stored in memory cells in which a read fail occurs when the read failure occurs during a read operation on the memory device.

According to the present technology, in an embodiment, a memory device may perform an operation of recovering data stored in memory cells in which a read fail occurs when the read failure occurs during a read operation on the memory device.

Figure 1:
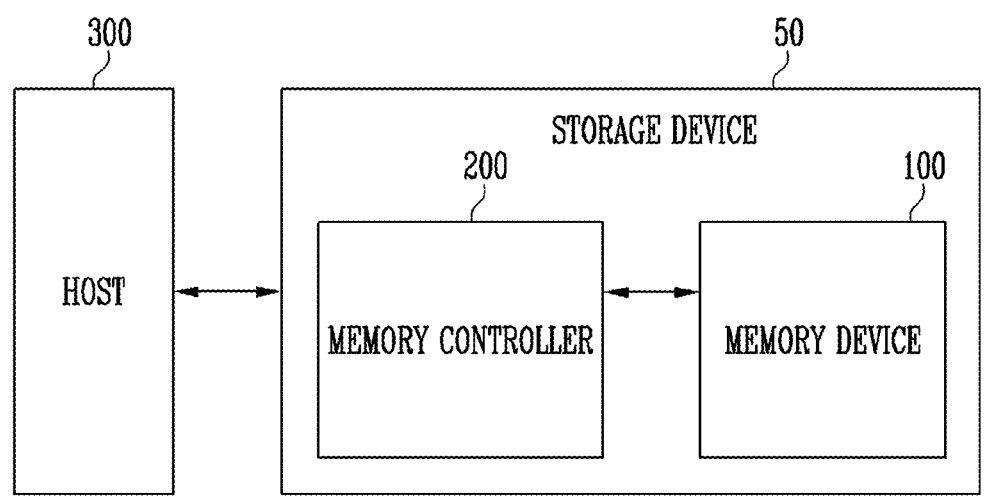
FIG. 1 is a block diagram illustrating a memory system according to an embodiment.

FIG. 1 is a block diagram illustrating a memory system according to an embodiment.

Referring to FIG. 1, a storage device 50 may include a memory device 100 and a memory controller 200 that controls an operation of the memory device. The storage device 50 is a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array including a plurality of memory cells that store data. The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR) SDRAM, a Rambus dynamic random access memory (ReDRAM), a NAND flash memory, a vertical NAND flash memory, a NOR flash memory, a resistive random access memory (ReRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access a region selected by the address of the memory cell array. That is, the memory device 100 may perform an operation that is the command on the region selected by the address. For example, the memory device 100 may perform a write operation (program operation), a read operation, and an erase operation. During the program operation, the memory device 100 may program data to the region selected by the address. During the read operation, the memory device 100 may read data from the region selected by the address. During the erase operation, the memory device 100 may erase data stored in the region selected by the address.

The memory controller 200 controls an overall operation of the storage device 50.

When power is applied to the storage device 50, the memory controller 200 may execute firmware (FW). When the memory device 100 is a flash memory device, the memory controller 200 may operate firmware such as a flash translation layer (FTL) for controlling communication between the host 300 and the memory device 100.

In an embodiment, the memory controller 200 may receive data and a logical block address (LBA) from the host 300 and convert the LBA into a physical block address (PBA) indicating an address of memory cells in which data included in the memory device 100 is to be stored.

The memory controller 200 may control the memory device 100 to perform the program operation, the read operation, or the erase operation in response to a request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. In this case, the memory controller 200 may control the memory devices 100 according to an interleaving method to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
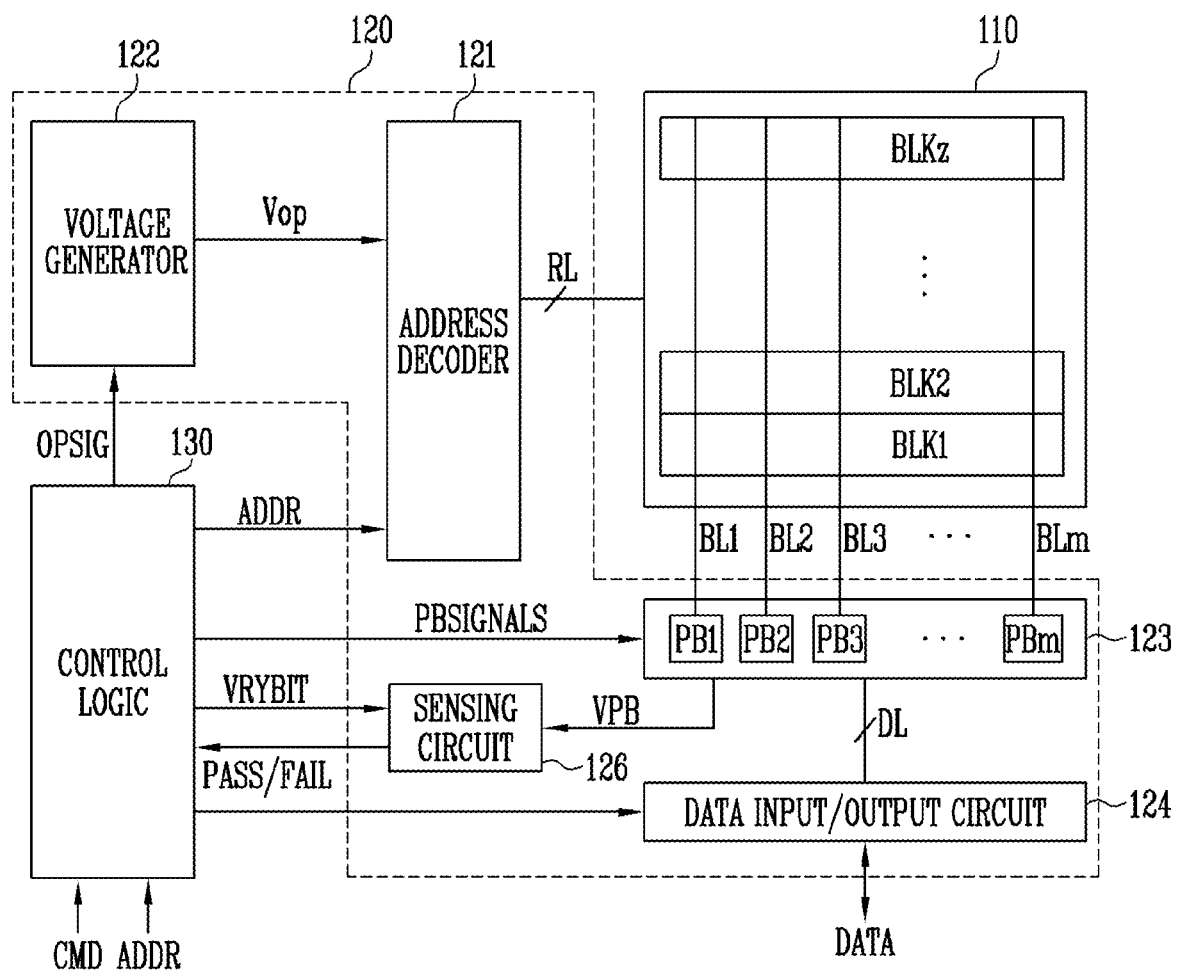
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and a control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. As an embodiment, the plurality of memory cells are nonvolatile memory cells. Memory cells connected to the same word line among the plurality of memory cells are defined as one physical page. That is, the memory cell array 110 is configured of a plurality of pages.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include an address decoder 121, a voltage generator 122, the read and write circuit 123, and a data input/output circuit 124.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz according to the decoded block address. The address decoder 121 is configured to decode a row address of the received address ADDR. The address decoder 121 may select at least one word line of a selected memory block by applying voltages provided from the voltage generator 122 to at least one word line.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage greater than the verify voltage to the unselected word lines.

During the read operation, the address decoder 121 may apply a read voltage to the selected word line and apply a read pass voltage greater than the read voltage to the unselected word lines.

According to an embodiment of the present disclosure, the erase operation of the memory device 100 is performed in a memory block unit. The address ADDR input to the memory device 100 during the erase operation includes a block address. The address decoder 121 may decode the block address and select one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of voltages by using an external power voltage supplied to the memory device 100. The voltage generator 122 operates in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate the plurality voltages using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of voltages having various voltage levels, the voltage generator 122 may include a plurality of pumping capacitors that receive the internal voltage and selectively activate the plurality of pumping capacitors in response to the control logic 130 to generate the plurality of voltages.

The plurality of generated voltages may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program pulse is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program allowable voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL1 to BLm and store the read data DATA in the first to m-th page buffers PB1 to PBm.

During the erase operation, the read and write circuit 123 may float the bit lines BL1 to BLm. As an embodiment, the read and write circuit 123 may include a column select circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, a sensing circuit 126 may generate a reference current in response to a signal of an allowable bit VRYBIT generated by the control logic 130 and may compare a sensing voltage VPB received from the read and write circuit 123 with a reference voltage generated by the reference current to output a pass signal PASS or a fail FAIL signal to the control logic 130.

In an embodiment, the sensing circuit 126 may include a current sensing circuit that counts the number of fail bits, which is the number of program-failed cells among target cells.

The control logic 130 may be connected to the address decoder 121, the voltage generator 122, the read and write circuit 123, the data input/output circuit 124, and the sensing circuit 126. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the address ADDR, a read and write circuit control signal PBSIGNALS, and the allowable bit VRYBIT in response to the command CMD and the address ADDR. The control logic 130 may output the operation signal OPSIG to the voltage generator 122, output the address ADDR to the address decoder 121, output the read and write control signal to the read and write circuit 123, and output the allowable bit VRYBIT to the sensing circuit 126. In addition, the control logic 130 may determine whether the verify operation is passed or failed in response to the pass signal PASS or the fail signal FAIL output by the sensing circuit 126.

Figure 3:
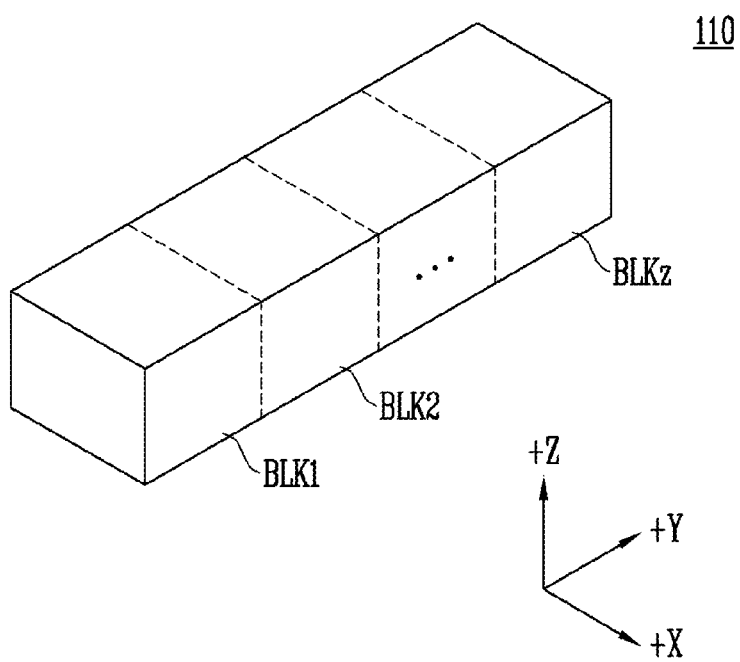
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIG. 4.

Figure 4:
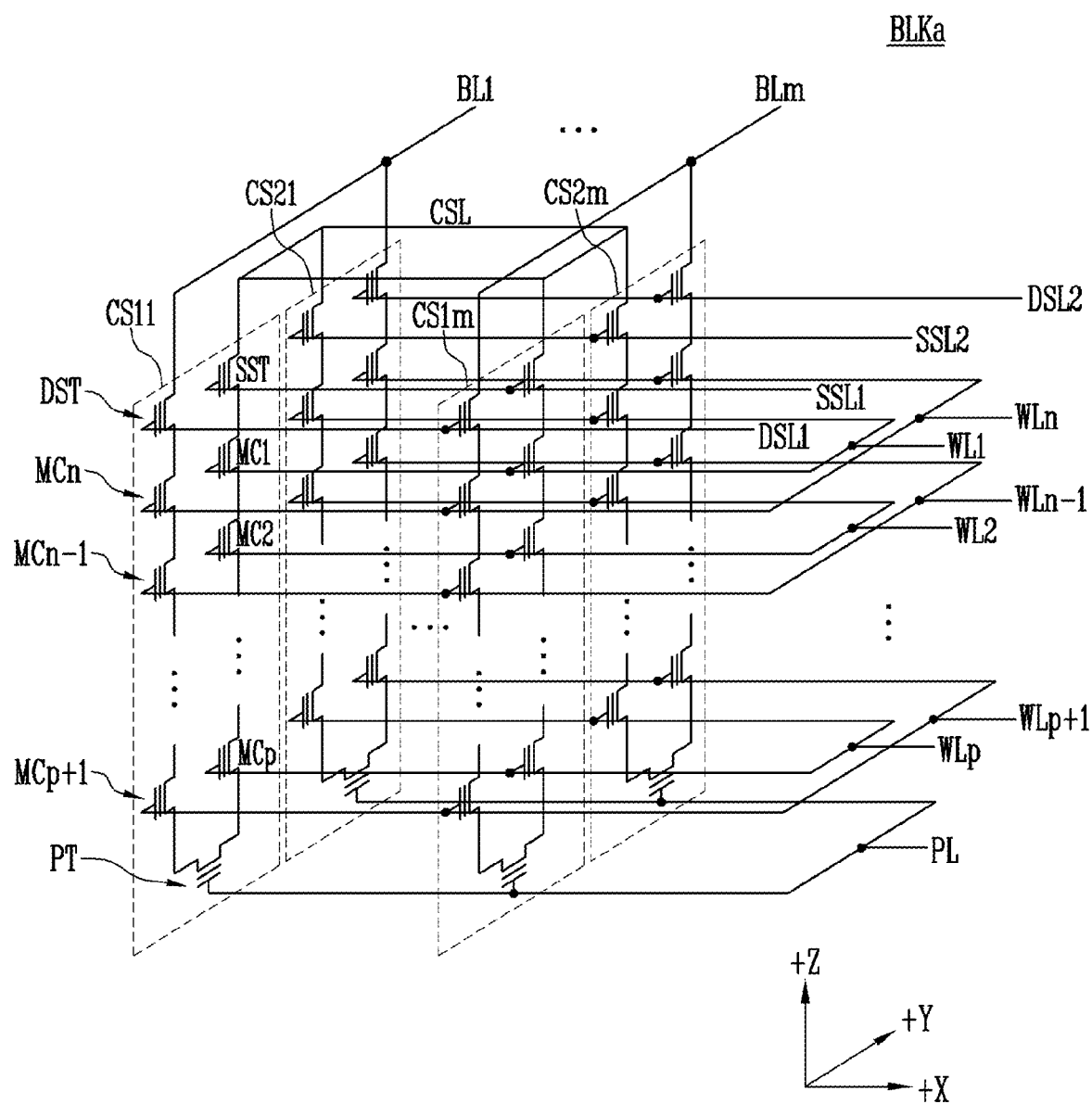
FIG. 4 is a circuit diagram illustrating any one memory block BLKa among memory blocks BLK1 to BLKz of FIG. 2.

FIG. 4 is a circuit diagram illustrating any one memory block BLKa among the memory blocks BLK1 to BLKz of FIG. 2.

Referring to FIG. 4, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

Figure 5:
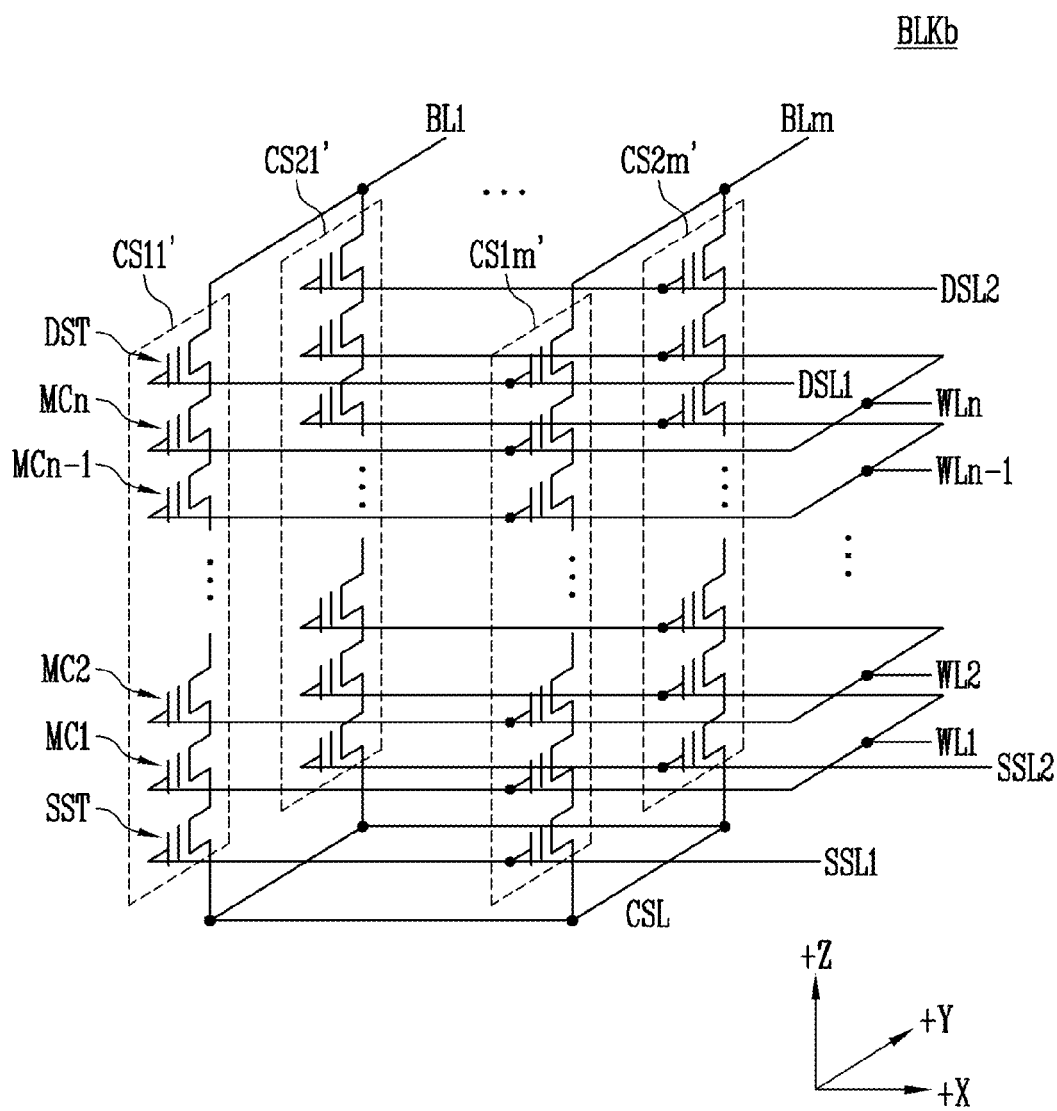
FIG. 5 is a circuit diagram illustrating another embodiment of any one memory block BLKb among the memory blocks BLK1 to BLKz of FIG. 2.

FIG. 5 is a circuit diagram illustrating another embodiment of any one memory block BLKb among the memory blocks BLK1 to BLKz of FIG. 2.

As another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to the bit lines, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation on the memory block BLKb is improved, however, the size of the memory block BLKb increases. As less memory cells are provided, the size of the memory block BLKb may be reduced, however, the reliability of the operation on the memory block BLKb may be reduced.

In order to efficiently control at least one dummy memory cell, each of the dummy memory cells may have a required threshold voltage. Before or after an erase operation on the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
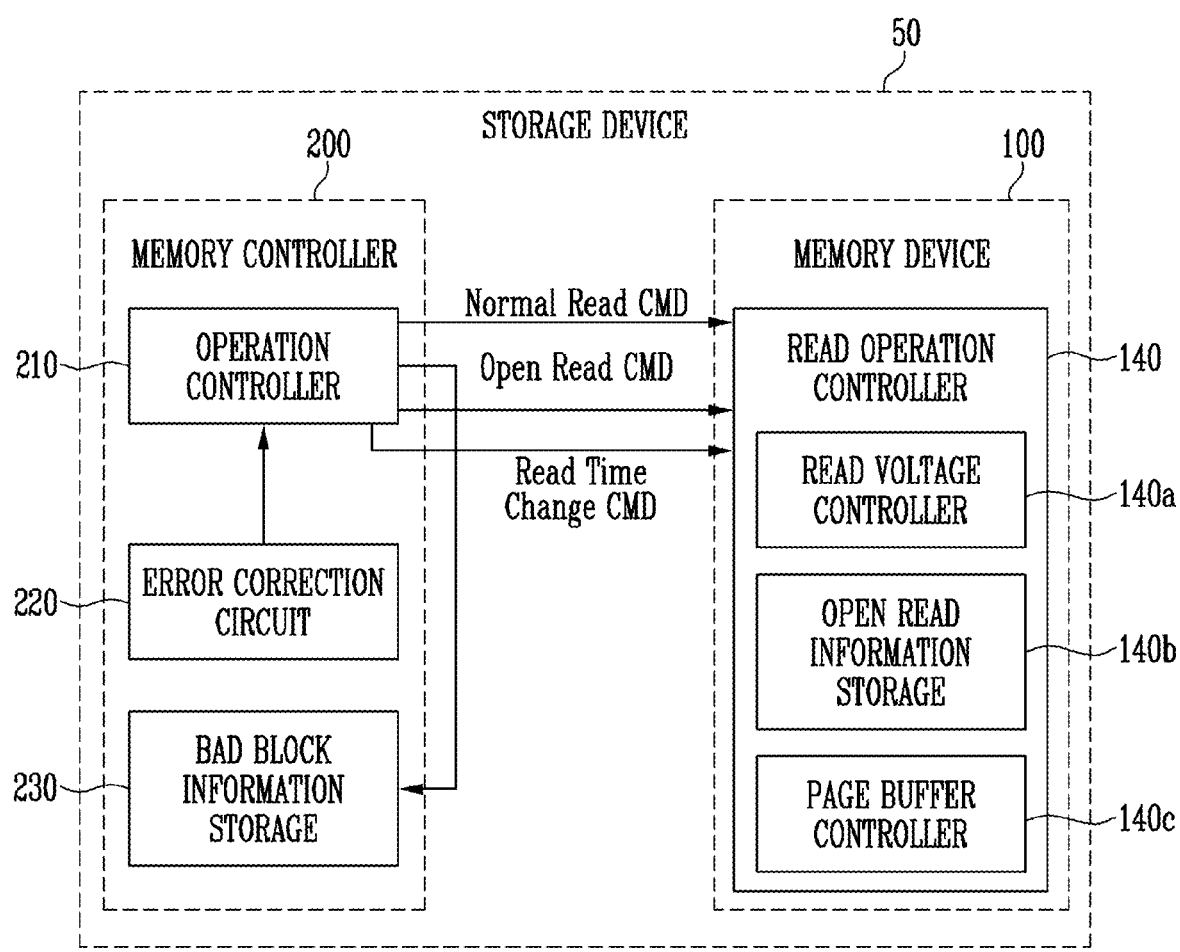
FIG. 6 is a block diagram illustrating a read operation for describing a configuration and an operation of a memory controller and a memory device according to an embodiment.

FIG. 6 is a block diagram illustrating a read operation for describing a configuration and an operation of a memory controller and a memory device according to an embodiment.

The storage device 50 may include the memory device 100 and the memory controller 200 controlling the memory device 100.

The memory controller 200 may include an operation controller 210, an error correction circuit 220, and a bad block information storage 230.

The operation controller 210 may control the operation of the memory device 100. The operation controller 210 may control the memory device 100 to perform the read operation of reading data stored in the memory cells included in the memory device 100. In an embodiment, the read operation may include a normal read operation and an open read operation.

The normal read operation may be an operation of reading the data stored in the memory cells using a preset default read voltage.

The open read operation may be a read operation performed when the normal read operation has failed. The open read operation may be an operation of reading the data stored in the memory cells connected to the selected word line when the selected word line corresponding to an address to be read is in an open state.

The operation controller 210 may provide a normal read command Normal Read CMD to the memory device 100 during the normal read operation. The operation controller 210 may provide an open read command Open Read CMD to the memory device 100 during the open read operation. In an embodiment, when the normal read operation failed, the operation controller 210 may control the memory device 100 to perform the open read operation. When the normal read operation is failed, the operation controller 210 may provide the open read command Open Read CMD to the memory device 100.

The operation controller 210 may provide a read time change command Read Time Change CMD to the memory device 100. The read time change command Read Time Change CMD may be a command to increase the target read time by the step read time in the open read operation.

In response to the normal read command Normal Read CMD, the memory device 100 may read the data stored in the memory cells connected to the selected word line. The memory device 100 may provide read data to the memory controller 200.

In response to the open read command Open Read CMD, the memory device 100 may read the data stored in the memory cells connected to the selected word line. The memory device 100 may provide read data to the memory controller 200.

The error correction circuit 220 may determine the number of error bits included in the data received from the memory device 100. The error correction circuit 220 may decode page data according to an error correction code.

Specifically, when the data received from the memory device 100 includes a preset number or more error bits, the error correction circuit 220 may determine that the read operation on the selected memory cells has failed. When the data received from the memory device 100 includes error bits of the number less than the preset number, the error correction circuit 220 may determine that the read operation on the selected memory cells has passed.

In an embodiment, the error correction circuit 220 may provide information on whether the read operation on the selected memory cells has passed or failed to the operation controller 210.

The bad block information storage 230 may include information on bad blocks among the memory blocks included in the memory device 100. The bad block may mean a memory block in which a read or program operation on a corresponding memory block is limited.

In an embodiment, the bad block information storage 230 may receive information on a target memory block including selected memory cells from the operation controller 210 and set the target memory block as the bad block.

The memory device 100 may include a read operation controller 140. The read operation controller 140 may include a read voltage controller 140a, an open read information storage 140b, and a page buffer controller 140c.

The read operation controller 140 may control the peripheral circuit to read the data stored in the memory cells connected to the selected word line in response to the open read command Open Read CMD of the memory controller 200.

Specifically, the read operation controller 140 may control the peripheral circuit to apply the pass voltage to word lines adjacent to the selected word line. The read operation controller 140 may control the peripheral circuit to discharge the pass voltage to a target pass voltage after a predetermined time elapses after the pass voltage is applied. After a voltage applied to the adjacent word lines is discharged to the target pass voltage, the read operation controller 140 may control the peripheral circuit to obtain the data stored in the selected memory cells through the bit lines connected to the selected memory cells after a target read time elapses. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

When the open read operation is failed, the read operation controller 140 may receive a read time change command Read Time Change CMD from the memory controller 200. The read operation controller 140 may increase the target read time by the step read time in response to a read time change command Read Time Change CMD. The read operation controller 140 may control the peripheral circuit to increase the target read time by a step read time and perform the open read operation.

In response to the open read command Open Read CMD of the memory controller 200, the read operation controller 140 may control the peripheral circuit to repeatedly perform the open read operation until the read operation on the selected memory cells is passed.

The read voltage controller 140a may control voltages applied to the plurality of word lines included in the memory device.

Specifically, the read voltage controller 140a may determine a magnitude of the pass voltage applied to the adjacent word lines adjacent to the selected word line, based on pass voltage magnitude information stored in the open read information storage 140b. The read voltage controller 140a may determine a magnitude of the target pass voltage based on the pass voltage magnitude information stored in the open read information storage 140b.

The read voltage controller 140a may determine a time when the pass voltage is applied to the adjacent word lines based on pass voltage time information stored in the open read information storage 140b.

The open read information storage 140b may include information on magnitudes of the voltages applied to the word lines adjacent to the selected word line. The open read information storage 140b may include information on a time when the voltage is applied to the word lines adjacent to the selected word line.

The open read information storage 140b may include read time information, which is information on a time during which the page buffer controller 140c senses a potential of the bit line connected to the selected memory cells. Specifically, the read time information may include target read time information and step read time information. The target read time information and the step read time information are described later with reference to FIGS. 12 and 13.

The page buffer controller 140c may control the peripheral circuit to sense the potential of the bit lines connected to the plurality of memory cells during the read operation. In an embodiment, the page buffer controller 140c may sense the potential of the bit line connected to the selected memory cells after the target read time elapses after the pass voltage applied to the adjacent word lines is discharged to the target pass voltage.

Figure 7:
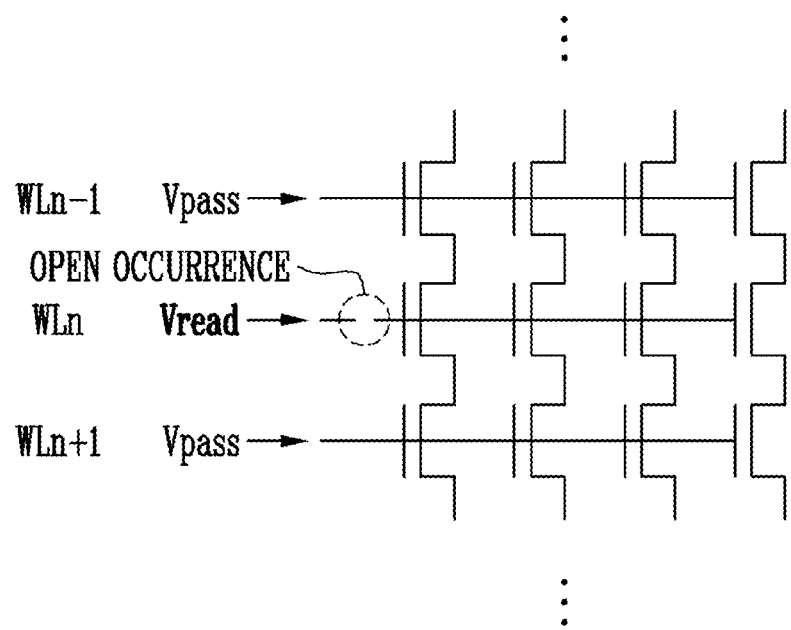
FIG. 7 is a diagram illustrating a state in which a specific word line among word lines of FIG. 4 is open.

FIG. 7 is a diagram illustrating a state in which a specific word line among the word lines of FIG. 4 is open.

The memory device may perform the read operation on the selected memory cells in response to the read command provided from the memory controller. The read operation may be performed in a page unit. The plurality of memory cells included in one page may be connected to the same word line. During the read operation, the read voltage may be applied to the word line connected to the selected memory cell. The pass voltage may be applied to the word lines connected to the unselected memory cells.

The read voltage and the pass voltage may be the voltages generated by the voltage generator 122 described with reference to FIG. 2. The generated read voltage and pass voltage may be provided to the word lines of the selected memory block according to control of the address decoder. At this time, an open state in which a connection between the address decoder and the word line of the selected memory block is cut may occur due to various reasons. A voltage to be applied might not be provided to the word line having the open state. Therefore, the selected memory cell may be read as a program state P even though the selected memory cell is in an erase state E, or may be read as the erase state E even though the selected memory cell is in the program state P. As a result, the read operation on the page including the selected memory cell may be determined as fail. In an embodiment, a cut in the word line between the address decoder and the selected memory block may cause an open circuit. In an embodiment, an open state in the word line between the address decoder and the selected memory block may be referred to as an open circuit.

Figure 8:
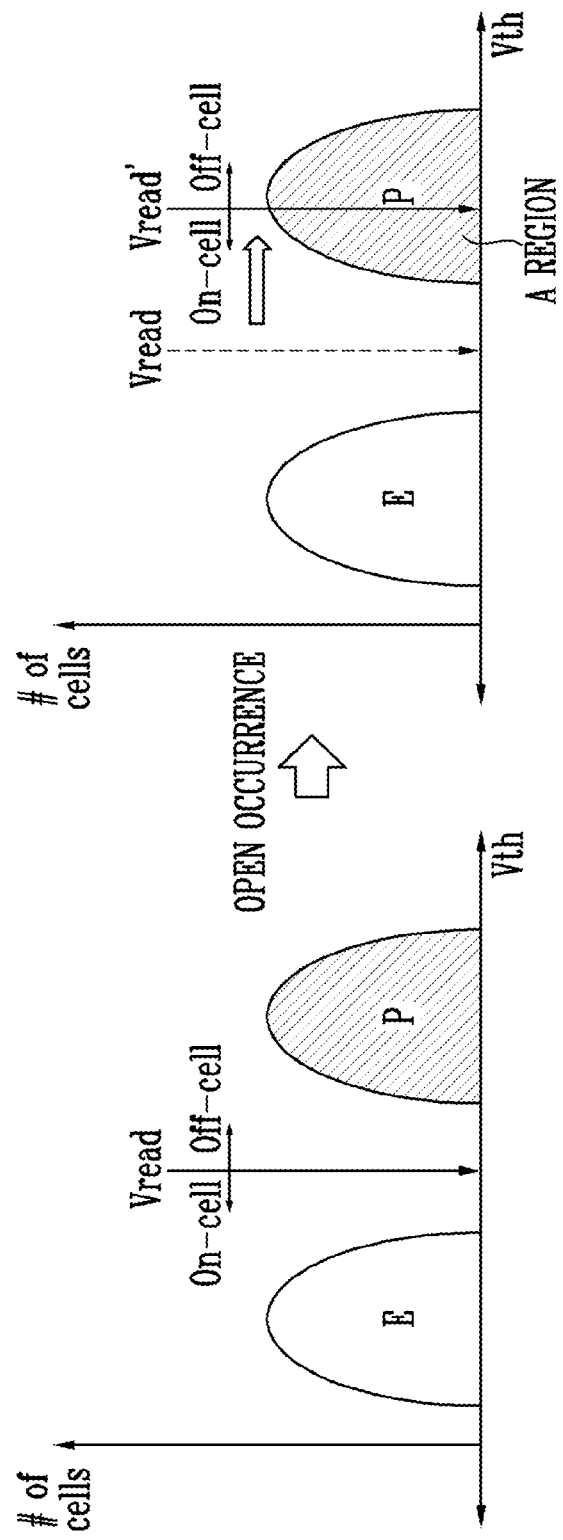
FIG. 8 is a diagram illustrating a case in which a read operation is failed when the specific word line described with reference to FIG. 7 is opened.

FIG. 8 is a diagram illustrating a case in which the read operation is failed when the specific word line described with reference to FIG. 7 is opened or has an open state.

The read voltage may be a voltage for reading the data stored in the selected memory cell. For example, in a case of an SLC, the read voltage may be a voltage for determining whether a threshold voltage of the selected memory cell is included in the erase state E or the program state P. The memory device may read the data stored in the selected memory cells using a read voltage between the erase state E and the program state P.

When the threshold voltage of the selected memory cell is included in the erase state E, the data stored in the selected memory cell may be read as '0'. When the threshold voltage of the selected memory cell is included in the program state P, the data stored in the selected memory cell may be read as '1'.

In an embodiment, when the selected word line connected to the selected memory cell is opened, the read voltage might not be transferred to a gate when the read voltage is applied to the gate of the selected memory cell. Instead, a potential of the selected word line may increase due to coupling by the pass voltage applied to the adjacent word lines adjacent to the selected word line. In this case, the potential of the selected word line when sensing the selected memory cells may be Vread'. Vread' may be greater than Vread, which is the read voltage for reading the data stored in the selected memory cell.

When the threshold voltage of the selected memory cell is less than Vread', the selected memory cell may be read as an on-cell. When the threshold voltage of the selected memory cell is greater than Vread', the selected memory cell may be read as an off-cell.

When the threshold voltage of the selected memory cell is included in a region A, the selected memory cell may be determined as in the erase state E even though the selected memory cell is in the program state P. Consequently, the read operation on the page including the selected memory cell may be a failure and the read operation may be deemed to have failed.

Figure 9:
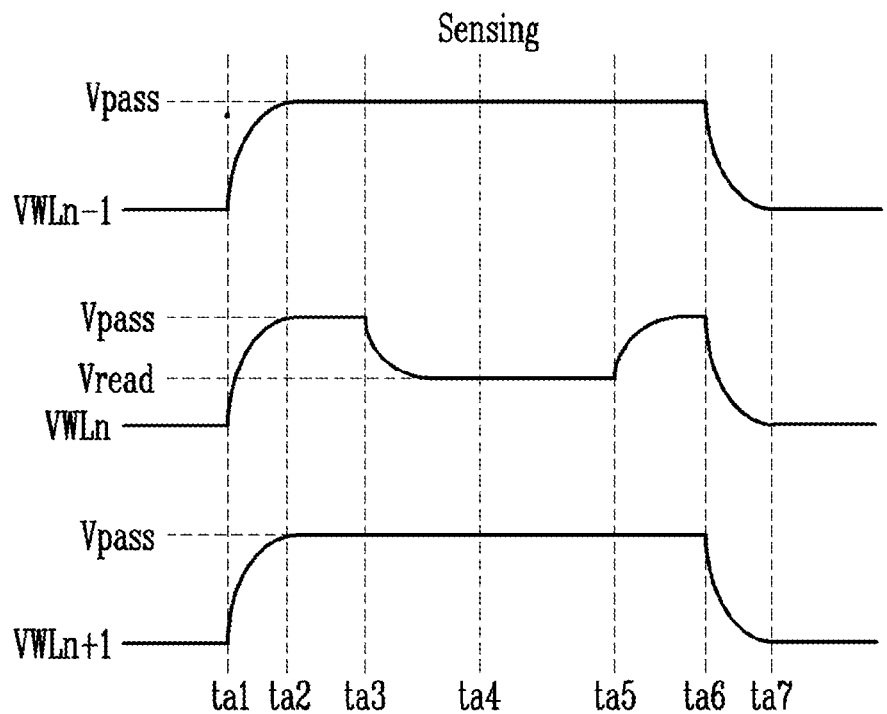
FIG. 9 is a diagram illustrating a voltage applied to a selected word line and word lines adjacent to the selected word line during the read operation over time.

FIG. 9 is a diagram illustrating the voltage applied to the selected word line and the word lines adjacent to the selected word line during the read operation over duration of time.

Referring to FIG. 9, VWLn indicates a potential according to a voltage applied to the selected word line WLn connected to the selected memory cell in the read operation. VWLn−1 and VWLn+1 indicate a potential according to a voltage applied to adjacent word lines WLn−1 and WLn+1, which are two word lines physically most adjacent to the selected word line WLn.

At ta1, the pass voltage Vpass may be applied to the selected word line WLn and the pass voltage Vpass may also be applied to the adjacent word lines WLn−1 and WLn+1.

At ta1, the potential VWLn of the selected word line and the potentials VWLn−1 and VWLn+1 of the adjacent word lines may reach the pass voltage Vpass.

At ta3, the read voltage Vread may be applied to the selected word line WLn. The potential of the selected word line WLn may be discharged from the pass voltage Vpass and may reach the read voltage Vread.

At ta4, the memory device may read the data stored in the selected memory cell by sensing the potential of the bit line connected to the selected memory cell.

At ta5, the pass voltage may be applied to the selected word line WLn.

At ta6, the potential VWLn of the selected word line may reach Vpass.

At ta7, the potential VWLn of the selected word line and the potentials VWLn+1 and VWLn−1 of the adjacent word lines may be discharged.

As described with reference to FIG. 9, when the word line is not opened, the memory device may sense the potential of the bit line connected to the selected memory cell after the potential of the selected word line reaches the read voltage Vread. In this case, the read operation might not be a failure or be deemed to have failed.

Figure 10:
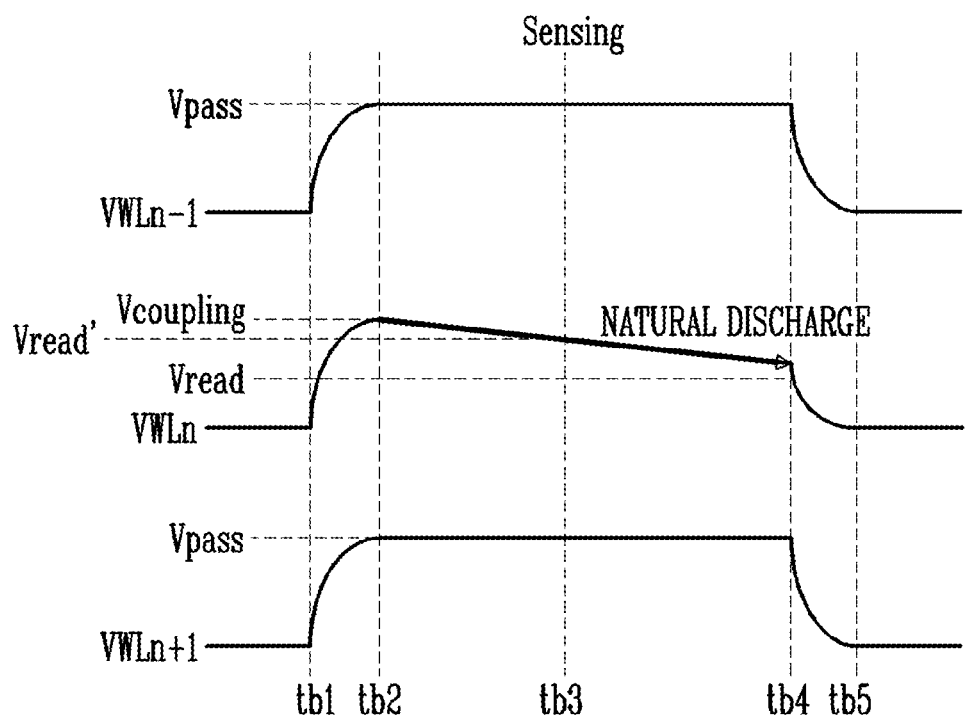
FIG. 10 is a diagram illustrating a case in which a read fail occurs when the selected word line is opened in the read operation.

FIG. 10 is a diagram illustrating a case in which a read fail occurs when the selected word line is opened in the read operation.

At tb1, the pass voltage Vpass may be applied to the selected word line WLn and two adjacent word lines WLn−1 and WLn+1. However, since the selected word line WLn is open, the pass voltage Vpass applied from the address decoder to the selected word line WLn might not be transferred to the selected word line WLn.

At tb2, potentials VWLn−1 and VWLn+1 of the two adjacent word lines may reach Vpass. The potential VWLn of the selected word line may increase to a coupling voltage Vcoupling by coupling according to the pass voltage Vpass applied to the two adjacent word lines WLn−1 and WLn+1. Since the selected word line WLn is opened and a voltage is not transferred to the selected word line Wn, the potential VWLn of the selected word line may be gradually discharged over time.

At tb3, the memory device may sense the potential of the bit line connected to the selected memory cell to obtain the data stored in the selected memory cell. In this case, the potential of the selected word line WLn may be Vread'. Vread' may be greater than Vread, which is the read voltage for reading the data stored in the selected memory cell.

From tb4 to tb5, the potential VWLn of the selected word line and the potentials VWLn+1 and VWLn−1 of the adjacent word lines may be discharged.

As described with reference to FIG. 10, when the word line is open, the memory device may sense the potential of the bit line connected to the selected memory cell before the potential of the selected word line WLn reaches the read voltage Vread. In this case, the read operation may be a failure and the read operation may be deemed to have failed.

Figure 11:
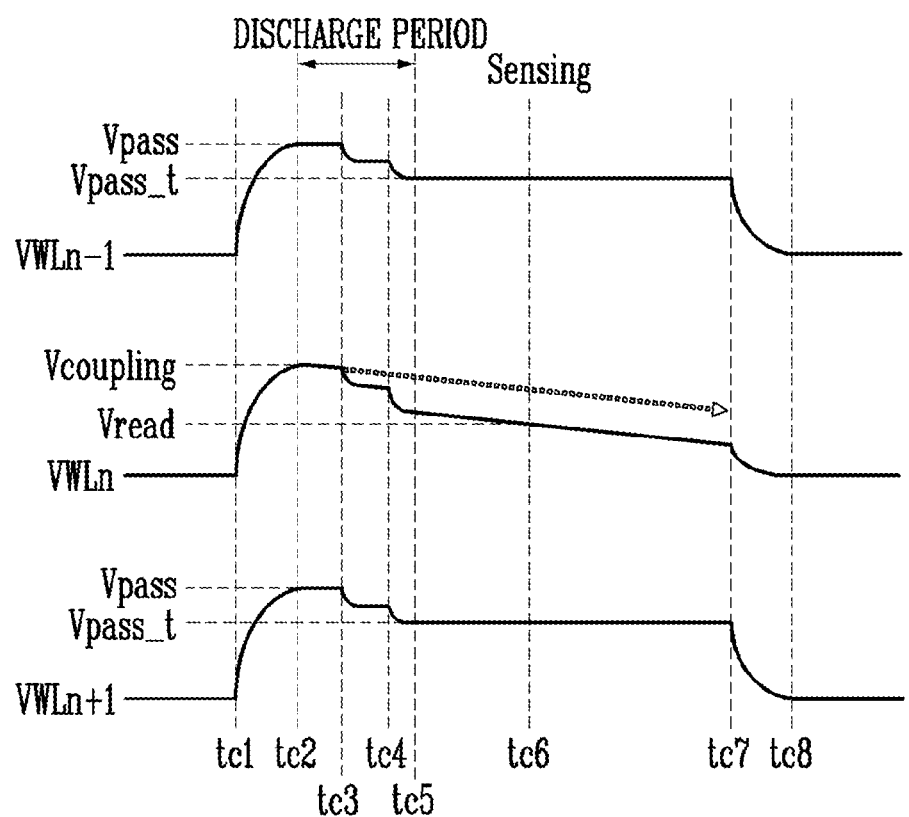
FIG. 11 is a diagram illustrating a read operation for recovering data stored in memory cells connected to a selected word line according to an embodiment.

FIG. 11 is a diagram illustrating a read operation for recovering data stored in memory cells connected to a selected word line according to an embodiment.

At tc1, the pass voltage Vpass may be applied to the adjacent word lines WLn−1 and WLn+1.

From tc1 to tc2, the potential VWLn of the selected word line may increase to the coupling voltage Vcoupling by the coupling according to the pass voltage Vpass applied to the two adjacent word lines WLn−1 and WLn+1.

From tc2 to tc5, the potentials VWLn−1 and VWLn+1 of the two adjacent word lines may be discharged to a target pass voltage Vpass_t. A discharge period may be a period in which the potentials VWLn−1 and VWLn+1 of the two adjacent word lines are discharged to the target pass voltage Vpass_t from tc2 to tc5. The target pass voltage Vpass_t may be a minimum voltage for forming a channel through which a current may flow in the channel region of the memory cells connected to the adjacent word lines WLn−1 and WLn+1. The discharge period may include a plurality of step periods. The potential VWLn of the selected word line may decrease by coupling according to the discharge of the pass voltage Vpass applied to the two adjacent word lines WLn−1 and WLn+1.

Thereafter, the potential VWLn of the selected word line may be gradually discharged over time and may reach the read voltage Vread at tc6. At tc6, the memory device may sense the potential of the bit line connected to the selected memory cell to obtain the data stored in the selected memory cell.

At tc6, since the potential VWLn of the selected word line when the memory device senses the voltage applied to the bit line connected to the selected memory cell is Vread, in this case, the read operation on the page including the selected memory cell may be a pass or be determined to be passed.

Figure 12:
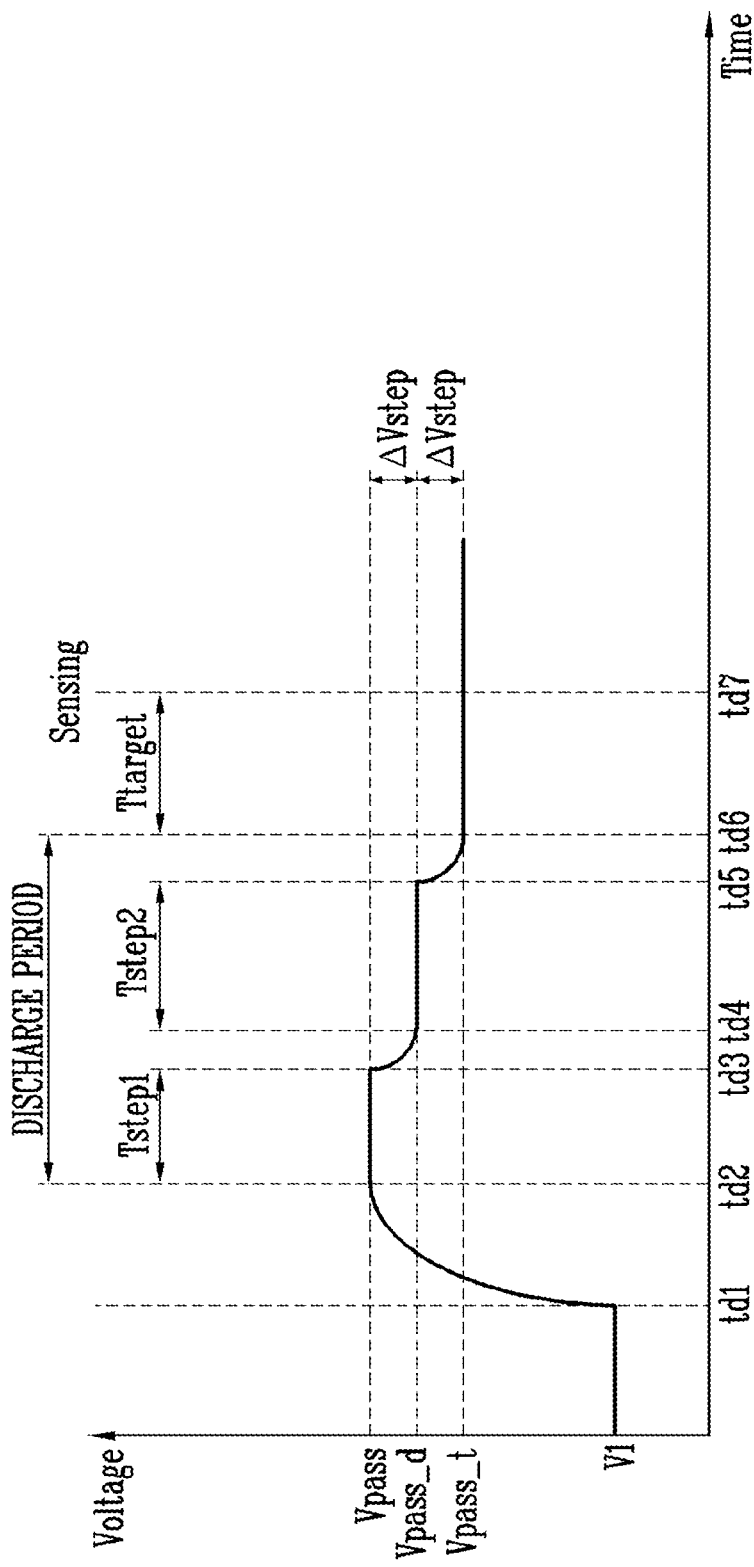
FIG. 12 is a diagram illustrating a voltage applied to adjacent word lines in a read operation over time according to an embodiment.

FIG. 12 is a diagram illustrating a voltage applied to adjacent word lines in a read operation over time according to an embodiment.

In an embodiment, when the memory device receives the open read command Open Read CMD from the memory controller, the read operation controller of the memory device may control the peripheral circuit to perform the read operation for recovering the data stored in the selected memory cell. The read voltage controller included in the read operation controller may determine the magnitude of the voltages applied to the adjacent word lines or the time where the voltages are applied to the adjacent word lines.

At td1, the pass voltage Vpass may be applied to two word lines adjacent to the selected word line.

At td2, the potential of the adjacent word lines may reach the pass voltage Vpass.

From td2 to td6 may be the discharge period. The discharge period may include a plurality of step periods.

From td2 to td3, the potential of the adjacent word lines may maintain the pass voltage Vpass during a first maintenance time Tstep1.

From td3 to td4, the potential of the adjacent word lines may be discharged to a discharge voltage Vpass_d. The pass voltage Vpass may be discharged by a step voltage ΔVstep.

From td4 to td5, the potential of the adjacent word lines may maintain the discharge voltage Vpass_d during a second maintenance time Tstep2.

From td5 to td6, the potential of the adjacent word lines may be discharged to the target pass voltage Vpass_t. The discharge voltage Vpass_d may be discharged by the step voltage ΔVstep). The target pass voltage Vpass_t may be a minimum voltage for forming the channel through which a current may flow in the channel region of the memory cells connected to the adjacent word lines.

At td7, after the potential of the adjacent word lines are discharged to the target pass voltage Vpass_t, the data stored in the selected memory cell may be obtained by sensing the potential of the bit line connected to the selected memory cell after a target read time Ttarget elapses.

The number of step periods included in the discharge period, a magnitude of the step voltage ΔVstep, and lengths of the first maintenance time Tstep1 and the second maintenance time Tstep2 are not limited by the embodiment of the present disclosure and may be variously set.

Figure 13:
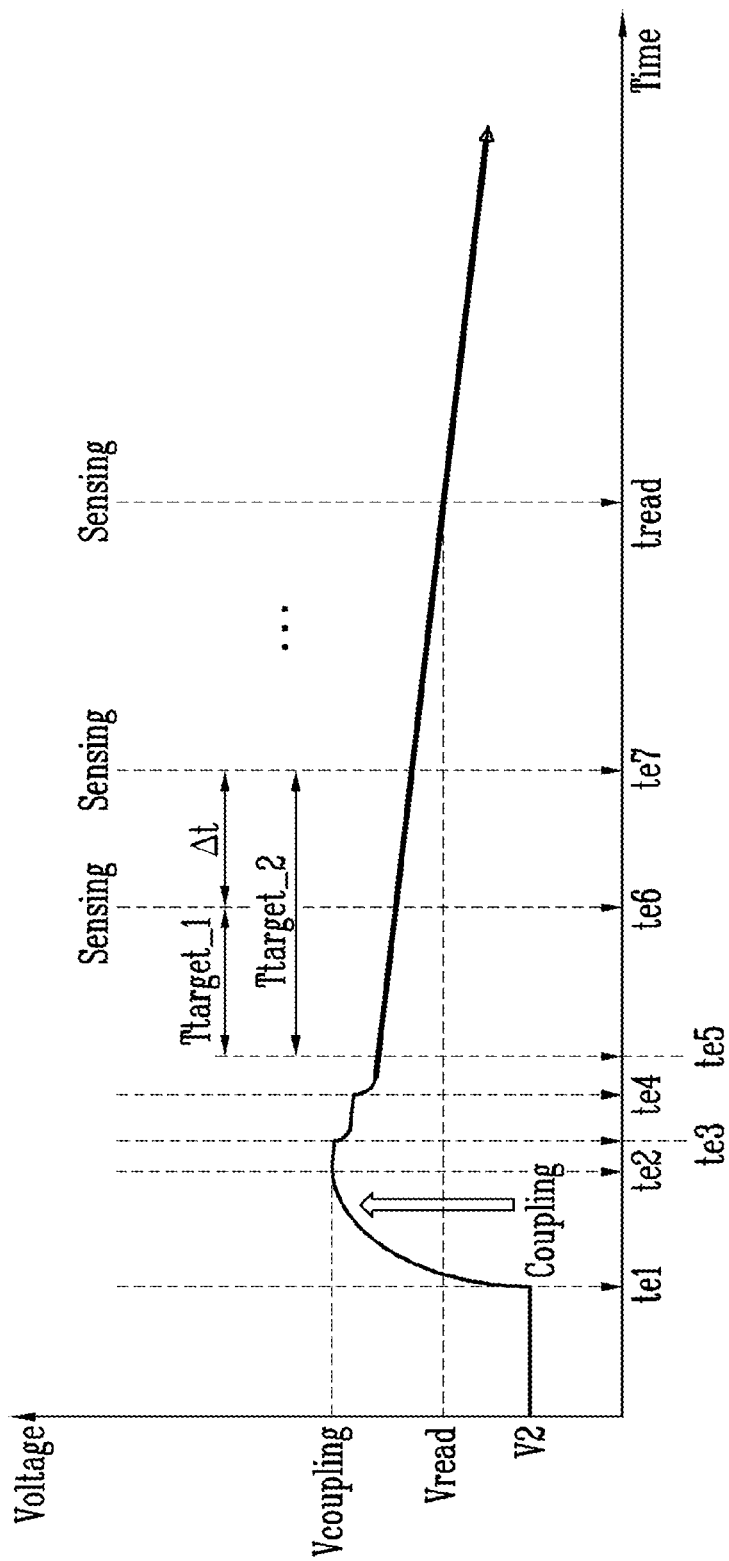
FIG. 13 is a diagram illustrating a potential that changes over time in a selected word line in a read operation according to an embodiment.

FIG. 13 is a diagram illustrating a potential that changes over time in a selected word line in a read operation according to an embodiment.

Referring to FIGS. 12 and 13, at te1, the pass voltage may be applied to the adjacent word lines.

At te2, the potential of the selected word line may increase from V2 to the coupling voltage Vcoupling by coupling with the adjacent word lines. V2 may be a ground voltage.

At te3, when the potential of the adjacent word lines are discharged from the pass voltage Vpass to the discharge voltage Vpass_d, the potential of the selected word line may be decreased by the coupling with the adjacent word lines.

At te4, when the potential of the adjacent word lines is discharged from the discharge voltage Vpass_d to the target pass voltage Vpass_t, the potential of the selected word line may be decreased by the coupling with the adjacent word lines.

At te6, the memory device may sense the potential of the bit line connected to the selected word line. te6 may be after a first target read time Ttarget_1 elapses from te5. te5 may be the same time as td6, which is a time when the voltage applied to the adjacent word lines is discharged to the target pass voltage Vpass_t in FIG. 12.

In te6, the potential of the selected word line may be greater than the read voltage Vread for reading the data stored in the selected memory cell. Therefore, the open read operation on the page including the selected memory cell may be a failure and the open read operation may be deemed to have failed.

When the open read operation has failed, the memory controller may repeatedly provide the open read command Open Read CMD to the memory device until the read operation on the page including the selected memory cell is passed. In this case, the target read time Ttarget may be sequentially increased by a step read time Δt whenever the open read operation is repeated.

Specifically, after the open read operation has failed, the memory device may perform the open read operation in response to the open read command Open Read CMD provided from the memory controller again.

At this time, the memory device may sense the potential of the bit line connected to the selected word line at te7. The potential of the selected word line at te7 may be greater than Vread. Therefore, the open read operation on the page including the selected memory cell may be a failure again.

In tread, the memory device may sense the potential of the bit line connected to the selected word line. The potential of the selected word line may be the same as the read voltage Vread at tread. Therefore, the open read operation on the page including the selected memory cell may be determined as a pass.

FIG. 14 is a diagram illustrating an open read information storage according to an embodiment.

During the open read operation, the memory device may perform the open read operation based on information stored in the open read information storage included in the read operation controller. Specifically, the open read information storage may include pass voltage information and read time information.

The pass voltage information may include information on a start pass voltage, a target pass voltage, a step voltage, a first maintenance time, a second maintenance time, a target read time, and a step read time.

The start pass voltage may refer to a pass voltage initially applied to the adjacent word lines adjacent to the selected word line in the open read operation.

The step voltage may refer to a magnitude of a voltage discharged from the start pass voltage in order to decrease the potential of the selected word line in the open read operation. For example, referring to FIG. 12, the start pass voltage may be applied to the adjacent word lines at td1, and the start pass voltage may be discharged by the step voltage at td3.

The target pass voltage may be a minimum voltage for forming the channel through which a current may flow in the channel region of the memory cells connected to the adjacent word lines. For example, the read operation controller of the memory device may sequentially decrease the voltage applied to the adjacent word line by the step voltage until the potential of the adjacent word lines reaches the target pass voltage from the start pass voltage, based on the information stored in the open read information storage.

The first maintenance time may refer to a time before the potential of the adjacent word line is discharged by the step voltage after the potential of the adjacent word line reaches the start pass voltage.

The second maintenance time may refer to a time before the potential of the adjacent word line is discharged to the target pass voltage after the potential of the adjacent word line is discharged from the start pass voltage by the step voltage.

According to the above description, a case in which the discharge period includes two step periods is described as an example, but the number of step periods is not limited by the embodiment of the present disclosure. For example, referring to FIG. 12, when the discharge period includes three step periods, the open read information storage may include information on a first maintenance time, a second maintenance time, and a third maintenance time.

The read time information may include information on a target read time and a step read time.

The target read time may refer to a time until the memory device senses the potential of the bit line connected to the selected memory cell after the potential of the adjacent word lines is discharged to the target pass voltage.

The step read time may refer to a time increased from the target read time when the memory device performs the open read command again in a case in which the open read operation has failed.

FIG. 15 is a diagram illustrating a bad block information storage according to an embodiment.

When the read operation on the specific page included in the memory device has failed, the operation controller inside the memory controller may set the memory block including the corresponding page as the bad block.

Specifically, the operation controller 210 may receive information on whether the read operation on the page corresponding to the read command has passed or failed from the error correction circuit. When the read operation on the selected memory cells has failed, the operation controller may provide information on the block including the selected memory cells to the bad block storage. The bad block storage may store bad block information provided from the operation controller. The bad block information may include information on a list of the bad blocks and an address of the bad blocks.

A memory operation on the memory blocks stored in the bad block storage may be limited. For example, when the memory controller provides the program command to the memory device, the memory controller may control the memory device to store data in a memory block except for memory blocks registered as the bad block, by referring to the bad block information stored in the bad block information storage.

Figure 16:
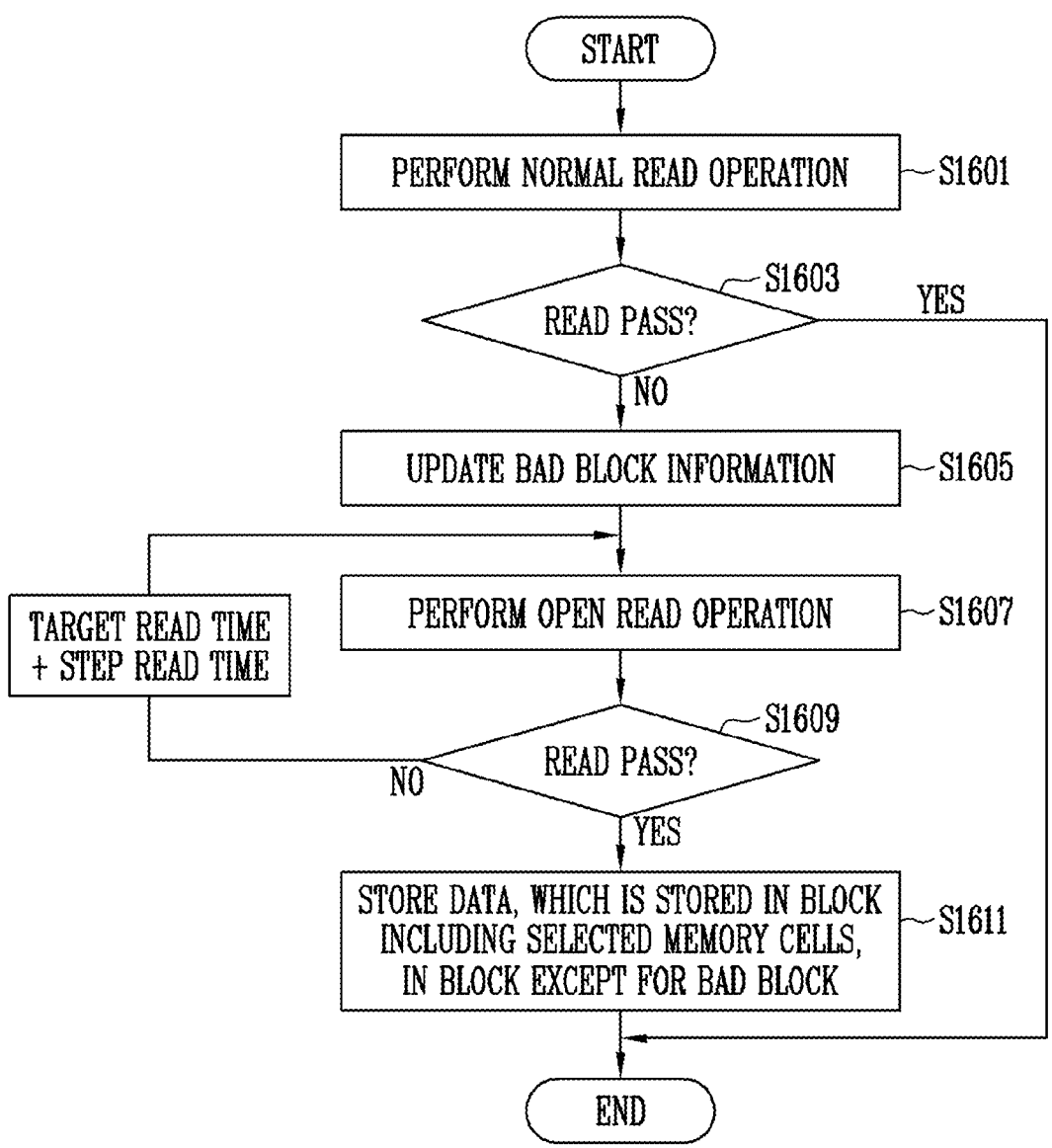
FIG. 16 is a flowchart illustrating an operation of a storage device according to an embodiment.

FIG. 16 is a flowchart illustrating an operation of a storage device according to an embodiment.

In step S1601, the storage device may perform the normal read operation of reading the data stored in the selected page in the memory device according to a request of the host. The normal read operation may refer to a read operation as a general memory operation, rather than the open read operation according to an embodiment of the present disclosure. The normal read operation may be an operation of reading the data stored in the memory cells using a preset default read voltage. The word "preset" as used herein with respect to a parameter, such as a preset default read voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In step S1603, the storage device may determine whether the normal read operation on the selected page has passed. When the normal read operation has passed, the read data may be transferred to the host, and the read operation of the storage device may end.

In step S1605, when the normal read operation has failed, the storage device may set the block including the corresponding page as the bad block. Specifically, the storage device may store the information on the block including the corresponding page in the bad block information storage inside the memory controller.

In step S1607, the storage device may perform the open read operation on the selected page. The open read operation may be the read operation performed when the normal read operation has failed. The open read operation may be the read operation for recovering the data stored in the selected page.

In step S1609, the storage device may determine whether the open read operation has passed. When the open read operation has failed, the storage device may perform the open read operation by increasing the target read time, which is the time for sensing the potential of the bit line connected to the selected memory cell, by the step read time.

In step S1611, when the open read operation has passed, the data stored in the target memory block including the selected page may be stored in another memory block.

After reading first data stored in the selected page, the storage device may read second data stored in pages except for the selected page among the pages included in the target memory block. The storage device may store the first data and the second data in another memory block other than the target memory block. In this case, the storage device may refer to the bad block information stored in the bad block information storage.

Figure 17:
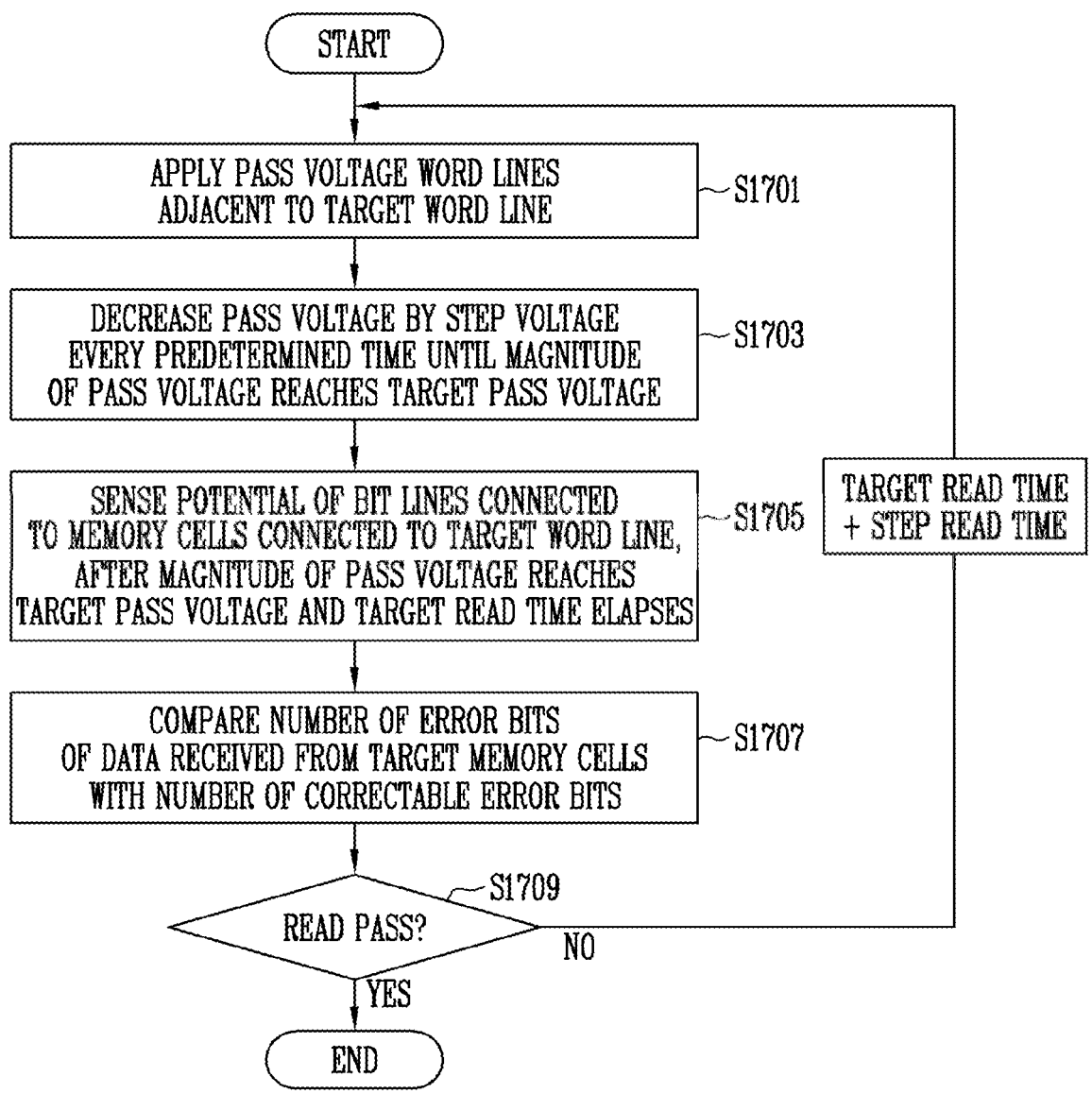
FIG. 17 is a flowchart illustrating a read operation according to an embodiment.

FIG. 17 is a flowchart illustrating an open read operation according to an embodiment.

In step S1701, the storage device may apply the pass voltage to the word lines adjacent to the target word line.

In step S1703, the storage device may decrease the pass voltage by the step voltage every predetermined time until the magnitude of the pass voltage reaches the target pass voltage.

In step S1705, the storage device may sense the potential of the bit lines connected to the memory cells connected to the target word line, after the magnitude of the pass voltage reaches the target pass voltage and the target read time elapses.

In step S1707, the number of error bits of the data read from the target memory cells and the number of correctable error bits may be compared.

In step S1709, the storage device may determine whether the read operation has passed. When the read operation has passed, the operation of the storage device may be ended. When the read operation has failed, the storage device may increase the target read time by the step read time and then perform the read operation again.

Figure 18:
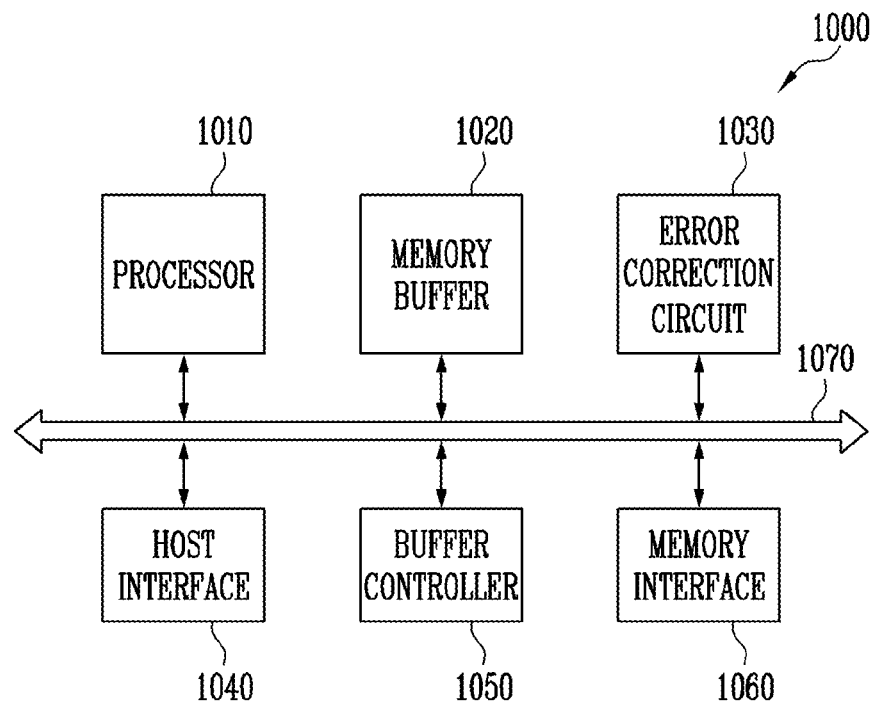
FIG. 18 is a diagram illustrating another embodiment of a memory controller of FIG. 1.

FIG. 18 is a diagram illustrating another embodiment of the memory controller of FIG. 1.

Referring to FIG. 18, the memory controller 1000 is connected to a host and the memory device. The memory controller 1000 is configured to access the memory device in response to a request from the host. For example, the memory controller 1000 is configured to control the write, read, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction circuit (ECC) 1030, a host interface 1040, a buffer control circuit 1050, a memory interface 1060, and a bus 1070.

The bus 1070 may be configured to provide a channel between components of the memory controller 1000.

The processor 1010 may control an overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of an FTL. The processor 1010 may convert an LBA provided by the host into a PBA through the FTL. The FTL may receive the LBA using a mapping table and convert the LBA into the PBA. An address mapping method of the flash translation layer may include various methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a de-randomizing seed. The de-randomized data may be output to the host.

As an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The ECC 1030 may perform error correction. The ECC 1030 may perform error correction encoding (ECC encoding) based on data to be written to the memory device through memory interface 1060. The error correction encoded data may be transferred to the memory device through the memory interface 1060. The ECC 1030 may perform error correction decoding (ECC decoding) on the data received from the memory device through the memory interface 1060. For example, the ECC 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a nonvolatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the ECC 1030, and the memory interface 1060. The control bus may be connected to the host interface 1040, the processor 1010, the buffer controller 1050, the memory buffer 1020, and the memory interface 1060.

Figure 19:
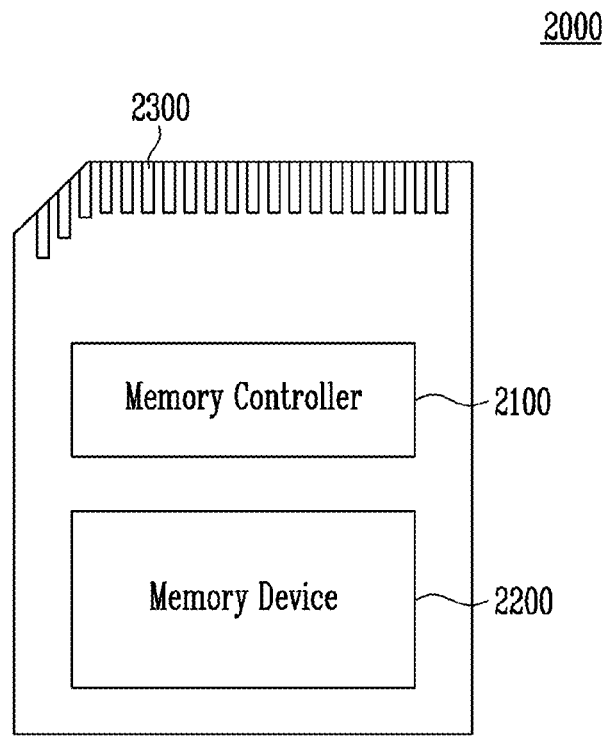
FIG. 19 is a block diagram illustrating a memory card system to which a storage device according to an embodiment of the present disclosure is applied.

FIG. 19 is a block diagram illustrating a memory card system to which a storage device according to an embodiment of the present disclosure is applied.

Referring to FIG. 19, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

For example, the memory controller 2100 may include components such as a random access memory (RAM), a processor, a host interface, a memory interface, and an ECC.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 20:
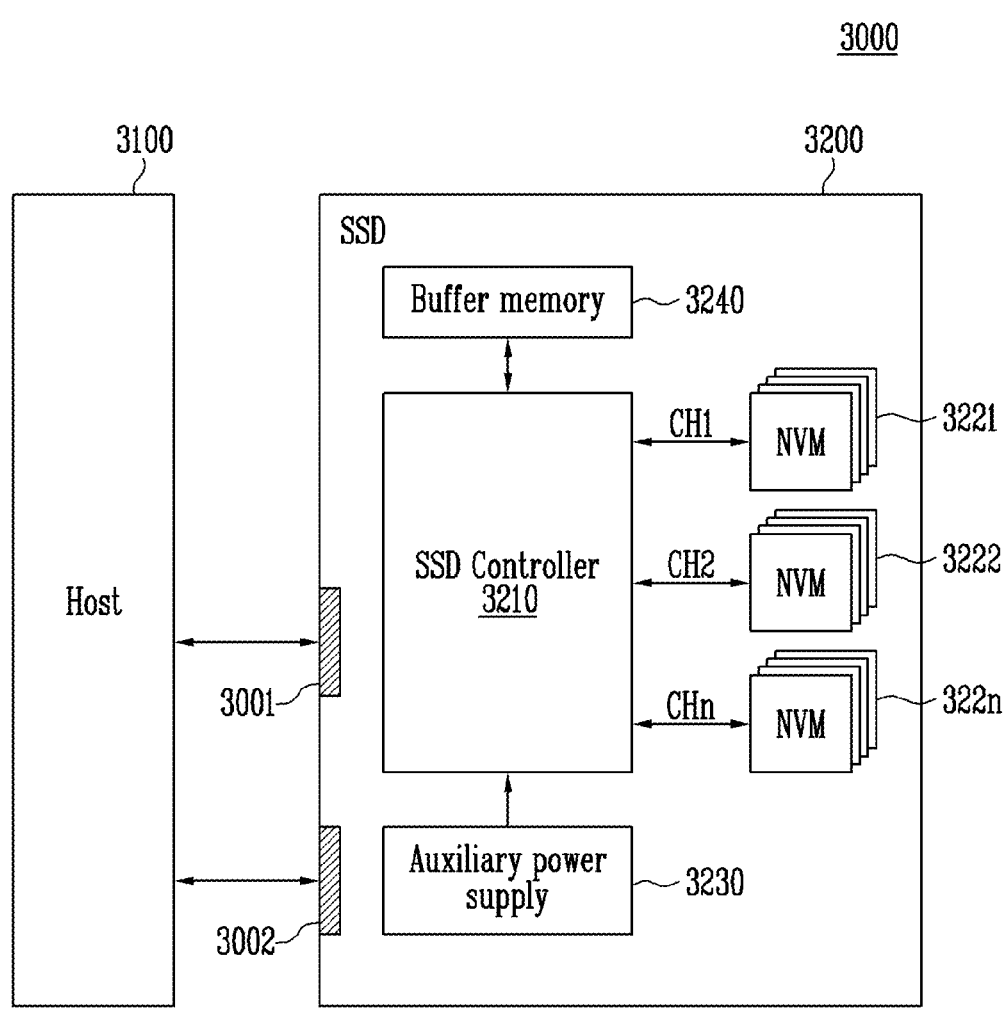
FIG. 20 is a block diagram illustrating a solid state drive (SSD) system to which a storage device according to an embodiment of the present disclosure is applied.

FIG. 20 is a block diagram illustrating a solid state drive (SSD) system to which a storage device according to an embodiment of the present disclosure is applied.

Referring to FIG. 20, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal received from the host 3100. For example, the signal may be signals based on an interface between the host 3100 and the SSD 3200. For example, the signal may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store meta data (for example, a mapping table) of the flash memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 21:
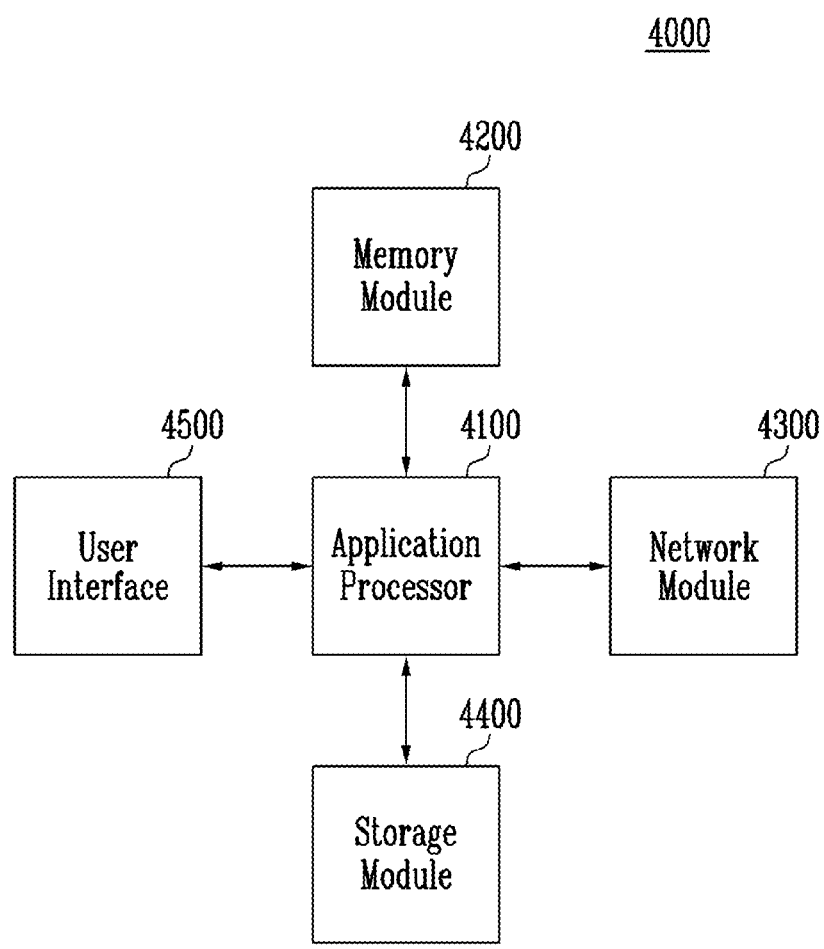
FIG. 21 is a block diagram illustrating a user system to which a storage device according to an embodiment of the present disclosure is applied.

FIG. 21 is a block diagram illustrating a user system to which a storage device according to an embodiment of the present disclosure is applied.

Referring to FIG. 21, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a nonvolatile semiconductor memory element such as a phase-change RAM (PRAM), a magnetic RAM (MRAM), a resistive RAM (ReRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   a plurality of memory cells respectively connected to a plurality of word lines;
   a peripheral circuit configured to perform a read operation of reading data stored in selected memory cells among the plurality of memory cells, the selected memory cells connected to a selected word line among the plurality of word lines; and
   a read operation controller configured to control the peripheral circuit to apply a pass voltage to adjacent word lines among the plurality of word lines adjacent to the selected word line during the read operation, discharge the pass voltage to a target pass voltage less than the pass voltage after a predetermined time elapses, and after a target read time elapses from when the pass voltage is discharged to the target pass voltage, obtain data stored in the selected memory cells through bit lines connected to the selected memory cells.

2. The memory device of claim 1, wherein the read operation controller comprises:
   an open read information storage configured to store pass voltage magnitude information which is information on magnitudes of the pass voltage and the target pass voltage; and
   a read voltage controller configured to determine the magnitudes of the pass voltage and the target pass voltage based on the pass voltage magnitude information.

3. The memory device of claim 2, wherein the open read information storage further comprises pass voltage time information which is information on the predetermined time, and
   the read voltage controller determines a time when the pass voltage is applied to the adjacent word lines based on the pass voltage time information.

4. The memory device of claim 1, wherein the read operation controller comprises a page buffer controller that controls page buffers connected to the bit lines to sense a potential of the bit lines after the target read time elapses.

5. The memory device of claim 2, wherein when a read fail occurs in the read operation, the read operation controller controls the peripheral circuit to further increase the target read time by a step read time in response to a read time change command of a memory controller, and perform the read operation by applying a read time changed according to the read time change command in response to a read command provided from the memory controller.

6. The memory device of claim 5, wherein the open read information storage further comprises read time information including information on the target read time and the step read time.

7. The memory device of claim 1, wherein the selected memory cells each include a memory cell configured to store one bit of data.

8. The memory device of claim 1, wherein the target pass voltage is a minimum voltage for forming a channel through which a current flows in a channel region of memory cells connected to the adjacent word lines.

9. The memory device of claim 1,
   wherein the selected word line is in an open state.

10. A storage device comprising:
    a memory device including a memory block including memory cells; and
    a memory controller comprising an operation controller configured to output a read command and an address for the memory cells, and provide an open read command and the address to the memory device when a read operation performed by the memory device in response to the read command has failed,
    wherein in response to the open read command, the memory device applies a pass voltage to adjacent word lines adjacent to a selected word line including the memory cells, discharges the pass voltage to a target pass voltage less than the pass voltage by a step voltage after a predetermined time elapses and, after a target read time elapses from when the pass voltage is discharged to the target pass voltage, obtains data stored in the memory cells through bit lines connected to the memory cells.

11. The storage device of claim 10, wherein when the open read operation has failed, the operation controller provides a read time change command for further increasing the target read time by a step read time to the memory device, and then provides the open read command for causing the memory device to perform the open read operation by applying a changed target read time according to the read time change command to the memory device.

12. The storage device of claim 11, wherein the operation controller repeatedly provides the read time change command and the open read command to the memory device until the open read operation for the memory cells has passed.

13. The storage device of claim 10, wherein the memory controller further comprises an error correction circuit that corrects an error bit of data read in the read operation or the open read operation, determines whether the read operation or the open read operation has passed or failed by comparing the number of error bits of the read data with the number of correctable error bits, and provides information on whether the read operation or the open read operation has passed or failed to the operation controller.

14. The storage device of claim 13, wherein the memory device comprises a plurality of memory blocks, and
the memory controller further comprises a bad block information storage that stores bad block information which is information on bad blocks on which a memory operation is limited among the plurality of memory blocks.

15. The storage device of claim 14, wherein when the open read operation has passed, the operation controller provides a program command to the memory device for causing the memory device to store data, which is stored in a first memory block including the memory cells, in a second memory block except for bad blocks among the plurality of memory blocks, and
the memory device programs the data stored in the first memory block to the second memory block in response to the program command.

16. The storage device of claim 10, wherein the memory device further comprises an open read information storage including pass voltage information that includes pass voltage magnitude information which is information on magnitudes of the pass voltage and the target pass voltage, information on the predetermined time, and information on the step voltage, and
the operation controller provides a command for changing at least one of the pass voltage magnitude information, the information on the predetermined time, and the information on the step voltage to the memory device.

17. A method of operating a storage device for performing a read operation of reading data stored in selected memory cells connected to a selected word line among a plurality of word lines included in a target memory block among a plurality of memory blocks, the method comprising:
applying a pass voltage to word lines adjacent to the selected word line;
discharging the pass voltage to a target pass voltage less than the pass voltage;
sensing a potential of bit lines connected to the selected memory cells connected to the selected word line after the pass voltage is discharged to the target pass voltage and a target read time elapses; and
determining whether the read operation has passed or failed by comparing the number of error bits of read data with the number of correctable error bits with respect to the selected memory cells.

18. The method of claim 17, wherein discharging the pass voltage to the target pass voltage comprises decreasing the pass voltage by a step voltage every predetermined time until a magnitude of the pass voltage reaches the target pass voltage.

19. The method of claim 17, further comprising:
repeatedly performing the read operation by increasing the target read time by a step read time until the read operation on the selected memory cells is passed when the read operation has failed.

20. The method of claim 17, further comprising:
storing data, which is stored in the selected memory cells, in a memory block except for the target memory block when the read operation has passed.

* * * * *